United States Patent
Cao

(10) Patent No.: US 11,957,029 B2
(45) Date of Patent: Apr. 9, 2024

(54) OLED DISPLAY PANEL

(71) Applicant: Wuhan China Star Optoelectronics Semiconductor Display Technology Co., Ltd., Hubei (CN)

(72) Inventor: Jun Cao, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 923 days.

(21) Appl. No.: 16/966,178

(22) PCT Filed: Dec. 16, 2019

(86) PCT No.: PCT/CN2019/125639
§ 371 (c)(1),
(2) Date: Jul. 30, 2020

(87) PCT Pub. No.: WO2021/103197
PCT Pub. Date: Jun. 3, 2021

(65) Prior Publication Data
US 2023/0180583 A1    Jun. 8, 2023

(30) Foreign Application Priority Data
Nov. 26, 2019   (CN) .......................... 201911171687.4

(51) Int. Cl.
| | |
|---|---|
| *H10K 59/80* | (2023.01) |
| *H10K 59/131* | (2023.01) |
| *H10K 77/10* | (2023.01) |
| *H10K 102/00* | (2023.01) |

(52) U.S. Cl.
CPC ......... *H10K 59/873* (2023.02); *H10K 59/131* (2023.02); *H10K 77/111* (2023.02); *H10K 2102/311* (2023.02)

(58) Field of Classification Search
CPC ........................... H10K 59/873; H10K 59/131
See application file for complete search history.

(56) References Cited

U.S. PATENT DOCUMENTS

| | | | |
|---|---|---|---|
| 11,233,217 B2 * | 1/2022 | Wang ................. | H10K 50/8426 |
| 2015/0116295 A1 * | 4/2015 | Pyon .................... | G09G 3/3233 |
| | | | 345/80 |
| 2016/0148562 A1 * | 5/2016 | Jung .................. | H10K 50/8426 |
| | | | 345/212 |
| 2016/0293884 A1 | 10/2016 | Zhang et al. | |
| 2017/0033312 A1 * | 2/2017 | Kim ..................... | H10K 59/131 |
| 2018/0061728 A1 * | 3/2018 | Chen ................... | H01L 27/1248 |

(Continued)

FOREIGN PATENT DOCUMENTS

| | | |
|---|---|---|
| CN | 108258146 | 7/2018 |
| CN | 108962953 | 12/2018 |

(Continued)

*Primary Examiner* — Nathan W Ha

(57) ABSTRACT

An OLED display panel comprises an array substrate and metal wiring layers, wherein one part of metal lines is arranged in a direction perpendicular to a first dam, and the other part of the metal lines forms acute angles with the first dam. A plurality of first grooves are defined in a fan-out area and arranged along the metal lines, and a plurality of second grooves are defined in the array substrate corresponding to a part of an area and arranged in the direction perpendicular to the first dam.

15 Claims, 4 Drawing Sheets

(56) References Cited

U.S. PATENT DOCUMENTS

| | | | | |
|---|---|---|---|---|
| 2018/0190742 A1* | 7/2018 | He | .................. | H10K 50/81 |
| 2019/0131569 A1* | 5/2019 | Ma | .................. | H10K 71/00 |
| 2019/0165080 A1* | 5/2019 | Ito | .................. | H10K 59/124 |
| 2019/0165084 A1* | 5/2019 | Park | .................. | H10K 59/131 |
| 2019/0189974 A1* | 6/2019 | Gunji | .................. | H10K 59/122 |
| 2019/0207160 A1* | 7/2019 | Wang | .................. | H10K 50/8445 |
| 2019/0214587 A1* | 7/2019 | Kim | .................. | H10K 50/11 |
| 2019/0348489 A1* | 11/2019 | Na | .................. | H01L 27/124 |
| 2020/0013843 A1* | 1/2020 | Choi | .................. | H10K 59/1213 |
| 2020/0176540 A1* | 6/2020 | Park | .................. | H10K 59/124 |
| 2020/0185647 A1* | 6/2020 | Lee | .................. | H10K 59/122 |
| 2020/0328172 A1* | 10/2020 | Lu | .................. | H05K 1/111 |
| 2022/0320466 A1* | 10/2022 | Chen | .................. | H10K 71/80 |

FOREIGN PATENT DOCUMENTS

| | | |
|---|---|---|
| CN | 109671866 | 4/2019 |
| CN | 109728194 | 5/2019 |
| CN | 109935169 | 6/2019 |
| CN | 110164949 | 8/2019 |

\* cited by examiner

OLED DISPLAY PANEL

RELATED APPLICATIONS

This application is a National Phase of PCT Patent Application No. PCT/CN2019/125639 having International filing date of Dec. 16, 2019, which claims the benefit of priority of Chinese Patent Application No. 201911171687.4 filed on Nov. 26, 2019. The contents of the above applications are all incorporated by reference as if fully set forth herein in their entirety.

FIELD AND BACKGROUND OF THE INVENTION

The present disclosure relates to the display technology field, and in particular, to an OLED display panel.

In flat-panel display technology, organic light-emitting diode (OLED) devices are widely used due to their advantages of light weight, thinness, flexibility, wide viewing angles, and more. However, light-emitting units of OLED devices are sensitive to moisture and oxygen, and need to be protected through encapsulation. In order to achieve a purpose of flexible display, thin film encapsulation is generally adopted, which is encapsulation by stacking inorganic/organic/inorganic layers. The inorganic layers act as barriers to moisture and oxygen, while the organic layer is for covering particles and relieving stress when bending the devices. The organic layer has fluidity, and in order to confine it to a specific area, a circle or several circles of dams are set around the devices. Further, organic layers of an array substrate near an inside area of the dams are usually removed to allow metal lines at edges of the devices to overlap with each other, or to increase a relative thickness of the organic layer of thin film encapsulation at an edge. However, when the organic layers near the inside area of the dams are removed, uneven layers such as inorganic/metal layers are exposed without being covered by the organic layers, leading to the inorganic/metal layers at different positions having different surface appearances on a border of a display panel, especially on a lower border having a greater number of metal lines and more complex surface appearances. Meanwhile, when encapsulated by thin films, the inorganic layers also have no flattening effect, making the organic layer of thin film encapsulation have different fluidities at positions where the organic layer has different surface appearances. The organic layer of thin film encapsulation is likely to diffuse across the dams, resulting in encapsulation failure after the organic layer contacts with an outside environment.

In conclusion, in existing OLED display panels, when the organic layers near the inside area of the dams are removed, the inorganic/metal layers at different positions have different surface appearances on the lower border having a greater number of metal lines, making the organic layer of thin film encapsulation have different fluidities at positions where the organic layer have different surface appearances, and leading to a likelihood of the organic layer of thin film encapsulation to diffuse across the dams, thereby resulting in encapsulation failure after the organic layer contacts with the outside environment.

In the existing OLED display panels, when the organic layers near the inside area of the dams are removed, the inorganic/metal layers at different positions have different surface appearances on the lower border having a greater number of metal lines, making the organic layer of thin film encapsulation have different fluidities at positions where the organic layer have different surface appearances, and leading to the likelihood of the organic layer of thin film encapsulation to diffuse across the dams, thereby resulting in encapsulation failure after the organic layer contacts with the outside environment.

SUMMARY OF THE INVENTION

In a first aspect, an embodiment of the present disclosure provides an OLED display panel comprising a display area and a non-display area surrounding the display area, wherein the OLED display comprises an array substrate, a first dam, a second dam, a plurality of metal lines, a plurality of first grooves, and a thin film encapsulation layer.

Wherein the first dam is disposed in the non-display area and surrounding the display area. The second dam is disposed in the non-display area and surrounding the first dam, and the second dam and the first dam are spaced apart from each other. The plurality of metal lines is disposed in a fan-out area of the array substrate near a lower border, wherein the fan-out area comprises a first area and a second area, the plurality of metal lines in the first area is arranged in a direction perpendicular to the first dam, and the plurality of metal lines in the second area forms acute angles with the first dam. The plurality of first grooves is disposed in the fan-out area and arranged along the plurality of metal lines. A plurality of second grooves is disposed in a portion of the array substrate corresponding to the second area and arranged in the direction perpendicular to the first dam, a distance between adjacent ones of the plurality of first grooves ranges from 10 μm to 1000 μm, and a distance between adjacent ones of the plurality of second grooves ranges from 10 μm to 1000 μm.

In the OLED display panel, bottom surfaces of the plurality of second grooves are strip-shaped or wave-shaped.

In the OLED display panel, a shape of a vertical cross-section of each of the plurality of second grooves is at least one of a rectangle, a trapezoid, and a circle, and a normal direction of the vertical cross-section is perpendicular to a normal direction of a plane in which the array substrate is located.

In the OLED display panel, adjacent ones of the second grooves are connected through a corresponding one of the plurality of first grooves.

In the OLED display panel, a portion of the array substrate corresponding to the non-display area and away from the fan-out area comprises a flexible substrate, an inorganic buffer layer, a blocking layer, a first gate insulating layer, a first metal wiring layer, a second gate insulating layer, a second metal wiring layer, an interlayer insulating layer, a source drain metal layer, a planarization layer, and a pixel definition layer.

In the OLED display panel, a sum of thicknesses of the first gate insulating layer and the second gate insulating layer is equal to a thickness of the first metal wiring layer, and a thickness of the second metal wiring layer is equal to the thickness of the first metal wiring layer.

In the OLED display panel, materials of the planarization layer and the pixel definition layer comprise organic photo resist.

In the OLED display panel, a portion of the array substrate corresponding to the plurality of first grooves comprises a flexible substrate, an inorganic buffer layer, a blocking layer, a first gate insulating layer, a first metal wiring layer, a second gate insulating layer, a second metal wiring layer, an interlayer insulating layer, and a source drain metal layer.

In the OLED display panel, a portion of the array substrate corresponding to the plurality of second grooves comprises a flexible substrate, an inorganic buffer layer, a blocking layer, a first metal wiring layer, a second metal wiring layer, an interlayer insulating layer, and a source drain metal layer.

An embodiment of the present disclosure also provides an OLED display panel comprising a display area and a non-display area surrounding the display area, wherein the OLED display comprises an array substrate, a first dam, a second dam, a plurality of metal lines, a plurality of first grooves, and a thin film encapsulation layer.

Wherein the first dam is disposed in the non-display area and surrounding the display area. The second dam is disposed in the non-display area and surrounding the first dam, and the second dam and the first dam are spaced apart from each other. The plurality of metal lines is disposed in a fan-out area of the array substrate near a lower border, wherein the fan-out area comprises a first area and a second area, the plurality of metal lines in the first area is arranged in a direction perpendicular to the first dam, and the plurality of metal lines in the second area forms acute angles with the first dam. The plurality of first grooves is disposed in the fan-out area and arranged along the plurality of metal lines, and a plurality of second grooves is disposed in a portion of the array substrate corresponding to the second area and arranged in the direction perpendicular to the first dam.

In the OLED display panel, a portion of the array substrate corresponding to the non-display area and away from the fan-out area comprises a flexible substrate, an inorganic buffer layer, a blocking layer, a first gate insulating layer, a first metal wiring layer, a second gate insulating layer, a second metal wiring layer, an interlayer insulating layer, a source drain metal layer, a planarization layer, and a pixel definition layer.

In the OLED display panel, a sum of thicknesses of the first gate insulating layer and the second gate insulating layer is equal to a thickness of the first metal wiring layer, and a thickness of the second metal wiring layer is equal to the thickness of the first metal wiring layer.

In the OLED display panel, materials of the planarization layer and the pixel definition layer comprise organic photo resist.

In the OLED display panel, a portion of the array substrate corresponding to the plurality of first grooves comprises a flexible substrate, an inorganic buffer layer, a blocking layer, a first gate insulating layer, a first metal wiring layer, a second gate insulating layer, a second metal wiring layer, an interlayer insulating layer, and a source drain metal layer.

In the OLED display panel, a portion of the array substrate corresponding to the plurality of second grooves comprises a flexible substrate, an inorganic buffer layer, a blocking layer, a first metal wiring layer, a second metal wiring layer, an interlayer insulating layer, and a source drain metal layer.

Compared to the prior art, in the OLED display panels provided by the embodiments of the present disclosure, the plurality of grooves perpendicular to the first dam are defined in areas where the plurality of metal lines and the first dam form the acute angles, thereby improving fluidity of the organic layer of thin film encapsulation at this position, further improving uniformity of the organic layer of thin film encapsulation on the lower border, and prolonging lifespan of the OLED display panels.

DESCRIPTION OF SPECIFIC EMBODIMENTS OF THE INVENTION

Embodiment of the present disclosure provide OLED display panels. Purposes and technical solutions of the present disclosure and the advantages thereof will be described in detail in the following with reference to exemplary embodiments and the corresponding accompanying drawings. It is understood that the exemplary embodiments as described here are just used for explaining the present disclosure, not for limiting the present disclosure.

In an OLED display panel in the prior art, when organic layers near an inside area of dams are removed, inorganic/metal layers at different positions have different surface appearances on a lower border having a greater number of metal lines, making an organic layer of thin film encapsulation have different fluidities at positions where the organic layer have different surface appearances, and leading to a likelihood of the organic layer of thin film encapsulation to diffuse across the dams, thereby resulting in encapsulation failure after the organic layer contacts with an outside environment. Embodiments of the present disclosure can solve these problems.

Figure 1:
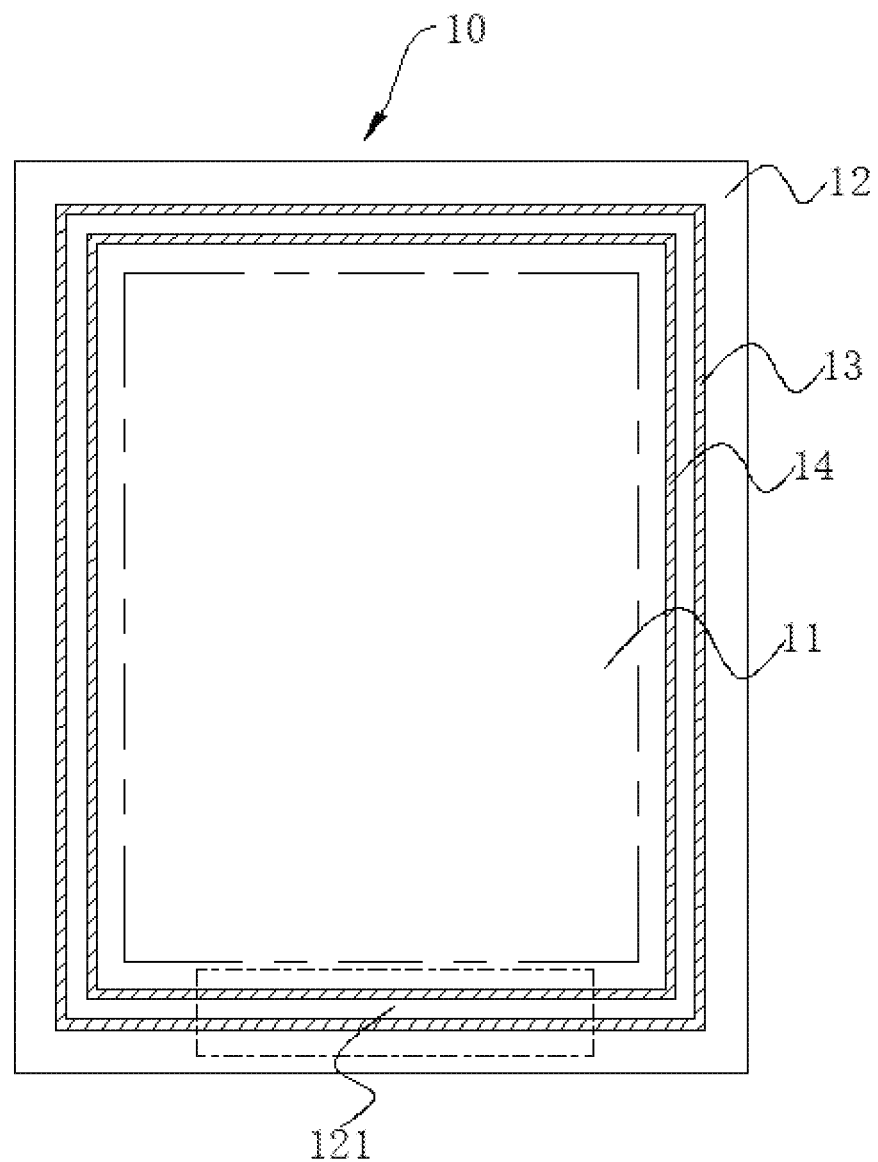
FIG. 1 is a schematic structural diagram illustrating an OLED display panel according to an embodiment of the present disclosure.

As shown in FIG. 1 which is a schematic structural diagram illustrating an OLED display panel according to an embodiment of the present disclosure, the OLED display panel comprises a display area 11 and a non-display area 12 surrounding the display area 11. The OLED display panel further comprises an array substrate 13, a first dam 14, and a second dam 15. The first dam 14 is disposed on the array substrate 13, disposed in the non-display area 12, and surrounding the display area 11. The second dam 15 is disposed on the array substrate 13, disposed in the non-display area 12, and surrounding the first dam 14, wherein the second dam 15 and the first dam 14 are spaced apart from each other, and each of the first dam 14 and the second dam 15 forms a ring-shaped structure.

Wherein, the first dam 14 is mainly used to define a boundary of the organic layer of thin film encapsulation. The second dam 15 is mainly used to prevent problems of reduced adhesion or moisture and oxygen permeation caused by a deposition of part of the organic layer of thin film encapsulation in an area where deposition is not expected when forming the organic layer of thin film encapsulation.

Preferably, materials of the first dam 14 and the second dam 15 can comprise organic materials such as photoresist, polyacrylic resin, polyimide resin, and acrylic resin, or inorganic materials of silicon compounds.

Specifically, the display area 11 comprises a plurality of pixels located at intersections of a plurality of scan lines and a plurality of data lines for displaying images. The non-display area 12 surrounds the display area and comprises a fan-out area 121 at a lower border of the array substrate 13. A plurality of metal lines are disposed in the fan-out area 121, wherein one part of the plurality of metal lines is arranged in a direction perpendicular to the first dam 14, and the other part of the plurality of metal lines forms acute angles with the first dam 14.

Figure 2:
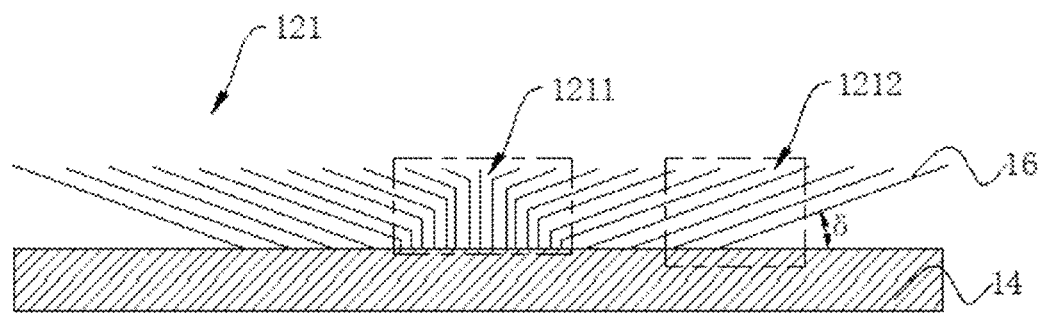
FIG. 2 is a schematic diagram illustrating an OLED display panel in a fan-out area according to an embodiment of the present disclosure.

As shown in FIG. 2 which is a schematic diagram illustrating an OLED display panel in a fan-out area according to an embodiment of the present disclosure, the plurality of metal lines 16 are disposed in the fan-out area 121. The fan-out area 121 comprises a first area 1211 and a second area 1212, wherein the plurality of metal lines 16 in the first area 1211 are arranged in the direction perpendicular to the first dam 14, and angles 6 between the plurality of metal lines 16 in the second area 1212 and the first dam 14 are acute.

In some embodiments, a plurality of first grooves are defined in the fan-out area 121 and arranged along the plurality of metal lines.

Figure 3:
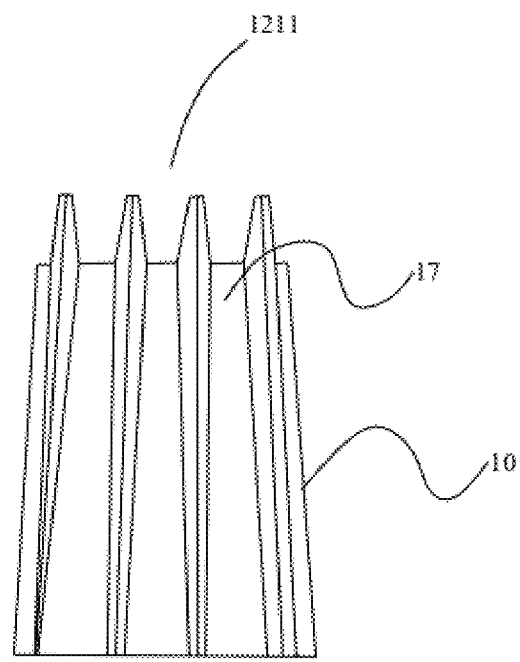
FIG. 3 is a schematic diagram illustrating first grooves of an OLED display panel in a fan-out area according to an embodiment of the present disclosure.

As shown in FIG. 3 which is a schematic diagram illustrating first grooves of an OLED display panel in a fan-out area according to an embodiment of the present disclosure, the plurality of first grooves 17 are defined in the fan-out area 121 and arranged along the plurality of metal lines 16. The plurality of first grooves 17 are formed by removing top two layers (a planarization layer and a pixel definition layer) of an array structure of the array substrate 10 corresponding to the fan-out area 121 through processes such as coating photoresist, exposure, development, and etching.

Specifically, a distance between adjacent plurality of first grooves ranges from 10 μm to 1000 μm.

Figure 4:
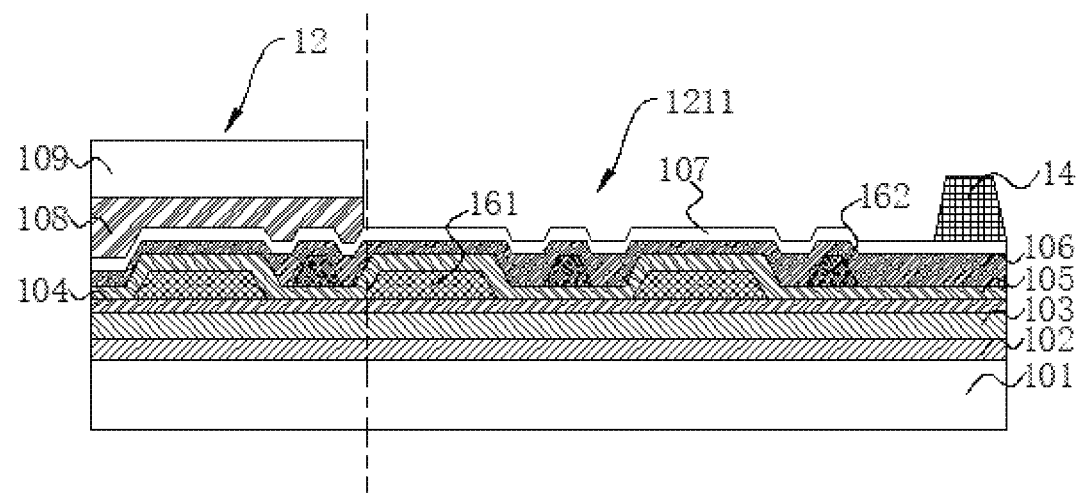
FIG. 4 is a schematic cross-sectional structural diagram illustrating an OLED display panel in a first area of a fan-out area according to an embodiment of the present disclosure.

As shown in FIG. 4 which is a schematic cross-sectional structural diagram illustrating an OLED display panel in a first area of a fan-out area according to an embodiment of the present disclosure, a portion of the array substrate 10 corresponding to the non-display area 12 and away from the fan-out area 121 comprises a flexible substrate 101, an inorganic buffer layer 102, a blocking layer 103, a first gate insulating layer 104, a first metal wiring layer 161, a second gate insulating layer 105, a second metal wiring layer 162, an interlayer insulating layer 106, a source drain metal layer 107, a planarization layer 108, and a pixel definition layer 109.

Specifically, a sum of thicknesses of the first gate insulating layer 104 and the second gate insulating layer 105 is equal to a thickness of the first metal wiring layer 161, and a thickness of the second metal wiring layer 162 is equal to the thickness of the first metal wiring layer 161.

Specifically, materials of the planarization layer 108 and the pixel definition layer 109 comprise organic photoresist.

Preferably, a material of the flexible substrate 101 consists of polyimide, and a material of the source drain metal layer 107 is same as a material of the first metal wiring layer 161.

Due to fluidity of the organic layer of thin film encapsulation when stacking inorganic/organic/inorganic layers for encapsulation, the first dam 14 and the second dam 15 are arranged around elements in order to confine the organic layer to a specific area.

The plurality of first grooves 17 are formed by etching the planarization layer 108 and the pixel definition layer 109 of the array substrate 10 near the inside area of the first dam 14, in a bid to allow the metal lines in the fan-out area 121 on the lower border of the OLED display panel to overlap with each other, or to increase a relative thickness of the organic layer of thin film encapsulation at an edge of the fan-out area 121. Therefore, the plurality of metal lines 16 in the first area 1211 are arranged in the direction perpendicular to the first dam 14 in the first area 1211, and a portion of the array substrate 10 corresponding to the plurality of first grooves 17 comprises the flexible substrate 101, the inorganic buffer layer 102, the blocking layer 103, the first gate insulating layer 104, the first metal wiring layer 161, the second gate insulating layer 105, the second metal wiring layer 162, the interlayer insulating layer 106, and the source drain metal layer 107.

Figure 5:
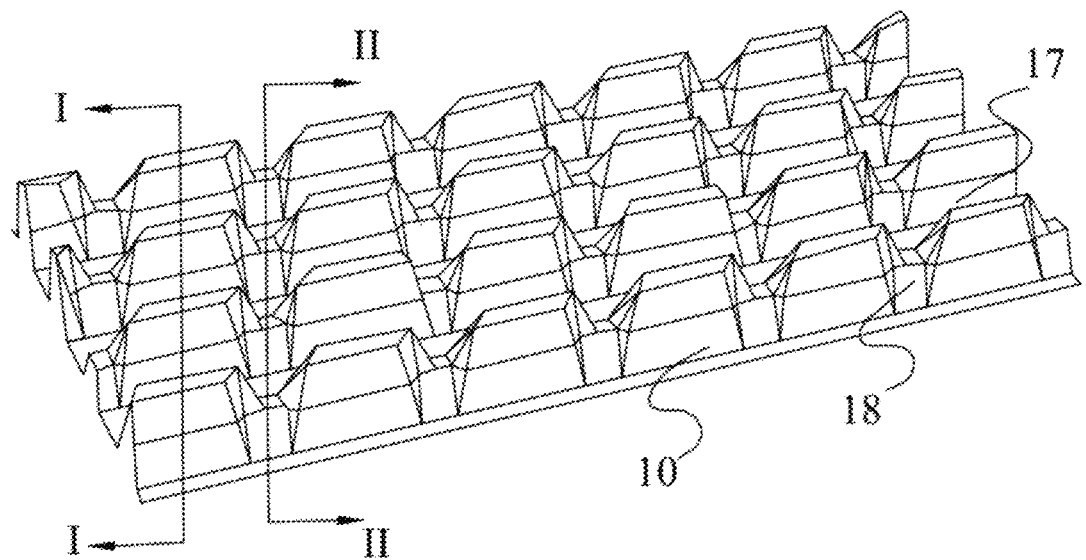
FIG. 5 is a schematic diagram illustrating second grooves of an OLED display panel in a fan-out area according to an embodiment of the present disclosure.

As shown in FIG. 5 which is a schematic diagram illustrating second grooves of an OLED display panel in a fan-out area according to an embodiment of the present disclosure, the angles between the plurality of metal lines 16 in the second area 1212 and the first dam 14 are acute. A plurality of second grooves 18 are defined in the second area 1212 and arranged in the direction perpendicular to the first dam 14.

Specifically, the plurality of second grooves 18 are formed by removing the gate insulating layers of the array structure of the array substrate 10 corresponding to the second area 1212 located on the metal wiring layers through processes such as coating photoresist, exposure, development, and etching.

Specifically, the plurality of second grooves 18 are arranged in the direction perpendicular to the first dam 14, and adjacent plurality of second grooves 18 are connected through corresponding first grooves 17.

Preferably, a distance between adjacent plurality of second grooves 18 ranges from 10 μm to 1000 μm, and bottom surfaces of the plurality of second grooves 18 are strip-shaped or wave-shaped.

Preferably, a shape of a vertical cross-section of each of the plurality of second grooves 18 is at least one of rectangular, trapezoidal, or circular, and a normal direction of the vertical cross-section is perpendicular to a normal direction of a plane in which the array substrate is located.

When carrying out thin film encapsulation, the organic layer of thin film encapsulation is printed on the array substrate 10. During printing the organic layer of thin film encapsulation, the organic layer of thin film encapsulation generally diffuses from the display area 11 to the non-display area 12. Due to a greater density of the metal lines on the lower border of the OLED display device, the metal lines in different areas have different extending directions, resulting in the organic layer of thin film encapsulation having different fluidities caused by different surface appearances. When a part of the organic layer of thin film encapsulation diffuses abnormally in the second area 1212 (the area where the metal lines and the dam form acute angles on the lower border of the OLED display panel), the organic layer of thin film encapsulation will first flow into the plurality of second grooves 18 in the second area 1212. Because extending directions of the plurality of the second grooves 18 are perpendicular to the first dam 14, the organic layer of thin film encapsulation flowing into the plurality of second grooves 18 will be blocked by the first dam 14, and the organic layer of thin film encapsulation will flow to a position where no abnormal diffusion occurs along the plurality of second grooves 18 and through corresponding plurality of first grooves 17 connected to the plurality of second grooves 18, greatly reducing a possibility of overflow of the organic layer of thin film encapsulation, thereby preventing encapsulation failure after the organic layer contacts with the outside environment, greatly improving encapsulation effect, and prolonging a lifespan of the OLED device.

Figure 6A:
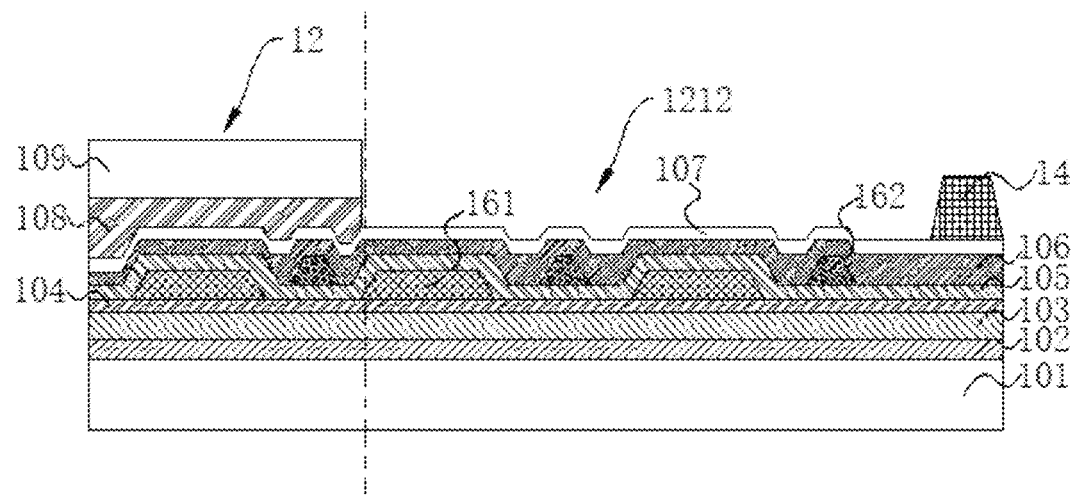
FIG. 6A is a schematic cross-sectional structural diagram taken along line I-I in FIG. 5.

As shown in FIG. 6A which is a schematic cross-sectional structural diagram taken along line I-I in FIG. 5, the portion of the array substrate 10 corresponding to the non-display area 12 and away from the fan-out area 121 comprises the flexible substrate 101, the inorganic buffer layer 102, the blocking layer 103, the first gate insulating layer 104, the first metal wiring layer 161, the second gate insulating layer 105, the second metal wiring layer 162, the interlayer insulating layer 106, the source drain metal layer 107, the planarization layer 108, and the pixel definition layer 109.

Specifically, the sum of thicknesses of the first gate insulating layer 104 and the second gate insulating layer 105 is equal to the thickness of the first metal wiring layer 161, and the thickness of the second metal wiring layer 162 is equal to the thickness of the first metal wiring layer 161.

Specifically, the materials of the planarization layer 108 and the pixel definition layer 109 comprise organic photoresist.

In the second area 1212, the angles between the plurality of metal lines 16 in the second area 1212 and the first dam 14 are acute, and the portion of the array substrate 10 corresponding to the plurality of first grooves 17 in the second area 1212 comprises the flexible substrate 101, the inorganic buffer layer 102, the blocking layer 103, the first gate insulating layer 104, the first metal wiring layer 161, the second gate insulating layer 105, the second metal wiring layer 162, the interlayer insulating layer 106, and the source drain metal layer 107.

Figure 6B:
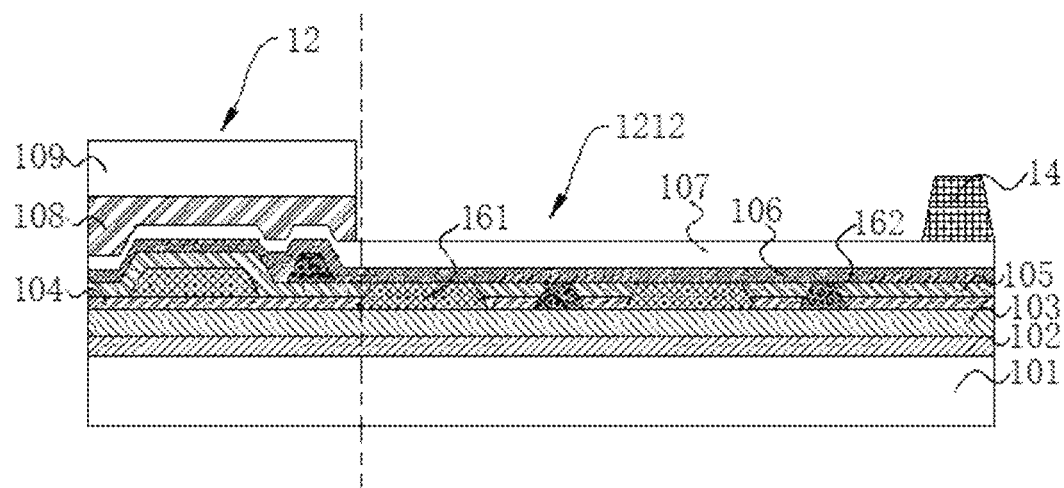
FIG. 6B is a schematic cross-sectional structural diagram taken along line II-II in FIG. 5.

As shown in FIG. 6B which is a schematic cross-sectional structural diagram taken along line II-II in FIG. 5, the portion of the array substrate 10 corresponding to the non-display area 12 and away from the fan-out area 121 comprises the flexible substrate 101, the inorganic buffer layer 102, the blocking layer 103, the first gate insulating layer 104, the first metal wiring layer 161, the second gate insulating layer 105, the second metal wiring layer 162, the interlayer insulating layer 106, the source drain metal layer 107, the planarization layer 108, and the pixel definition layer 109. In some embodiments, the sum of thicknesses of the first gate insulating layer 104 and the second gate insulating layer 105 is equal to the thickness of the first metal wiring layer 161, and the thickness of the second metal wiring layer 162 is equal to the thickness of the first metal wiring layer 161. In some embodiments, the materials of the planarization layer 108 and the pixel definition layer 109 comprise organic photoresist.

In the second area 1212, the angles between the plurality of metal lines 16 in the second area 1212 and the first dam 14 are acute. The plurality of second grooves 18 are formed by etching the first gate insulating layer 104 and the second gate insulating layer 105 on the first metal wiring layer 161 and the second metal wiring layer 162, and are arranged in the direction perpendicular to the first dam 14. Therefore, a portion of the array substrate 10 corresponding to the plurality of second grooves 18 in the second area 1212 comprises the flexible substrate 101, the inorganic buffer layer 102, the blocking layer 103, the first gate insulating layer 104, the first metal wiring layer 161, the second gate insulating layer 105, the second metal wiring layer 162, the interlayer insulating layer 106, and the source drain metal layer 107.

The embodiments of the present disclosure provide a structural design of an OLED device on the lower border. As the metal lines on the lower border have a greater density and different extending directions, the difference in fluidities of the organic layer of thin film encapsulation is also greater. In areas where the metal lines and the dam form acute angles, the organic layer of thin film encapsulation has poor fluidity. In the embodiments of the present disclosure, the inorganic layer under these areas is etched under certain rules to form a plurality of grooves perpendicular to the dam, thereby improving the fluidity of the organic layer of thin film encapsulation, and further improving uniformity of the organic layer of thin film encapsulation on the lower border.

In the embodiments mentioned above, there are different emphases in descriptions of the embodiments. For parts not described in detail in one embodiment, please refer to the relevant descriptions of other embodiments.

In conclusion, in the OLED display panels provided by the embodiments of the present disclosure, the plurality of grooves perpendicular to the first dam are defined in the areas where the plurality of metal lines and the first dam form the acute angles, thereby improving fluidity of the organic layer of thin film encapsulation in this position, further improving uniformity of the organic layer of thin film encapsulation on the lower border, and prolonging the lifespan of the OLED display panels.

It can be understood that, those having ordinary skills of the art may make equivalent changes and modifications according to the technical solution and technical ideas of the present disclosure and all these changes and modifications are considered within the protecting scope of the attached claims of the present disclosure.

What is claimed is:

1. An OLED display panel comprising a display area and a non-display area surrounding the display area, wherein the OLED display panel comprises:
    an array substrate;
    a first dam disposed on the array substrate, disposed in the non-display area, and surrounding the display area;
    a second dam disposed on the array substrate, disposed in the non-display area, and surrounding the first dam, wherein the second dam and the first dam are spaced apart from each other;
    a plurality of metal lines disposed in a fan-out area of the array substrate near a lower border, wherein the fan-out area comprises a first area and a second area, the plurality of metal lines in the first area are arranged in a direction perpendicular to the first dam, and angles between the plurality of metal lines in the second area and the first dam are acute; and
    a plurality of first grooves defined in the fan-out area and arranged along the plurality of metal lines;
    wherein a plurality of second grooves are defined in a portion of the array substrate corresponding to the second area and arranged in the direction perpendicular to the first dam, a distance between adjacent plurality of first grooves ranges from 10 μm to 1000 μm, and a distance between adjacent plurality of second grooves ranges from 10 μm to 1000 μm.

2. The OLED display panel as claimed in claim 1, wherein bottom surfaces of the plurality of second grooves are strip-shaped or wave-shaped.

3. The OLED display panel as claimed in claim 1, wherein a shape of a vertical cross-section of each of the plurality of second grooves is at least one of rectangular, trapezoidal, or circular, and a normal direction of the vertical cross-section is perpendicular to a normal direction of a plane in which the array substrate is located.

4. The OLED display panel as claimed in claim 1, wherein the adjacent second grooves are connected through corresponding first grooves.

5. The OLED display panel as claimed in claim 1, wherein a portion of the array substrate corresponding to the non-display area and away from the fan-out area comprises a flexible substrate, an inorganic buffer layer, a blocking layer, a first gate insulating layer, a first metal wiring layer, a second gate insulating layer, a second metal wiring layer, an interlayer insulating layer, a source drain metal layer, a planarization layer, and a pixel definition layer.

6. The OLED display panel as claimed in claim 5, wherein a sum of thicknesses of the first gate insulating layer and the second gate insulating layer is equal to a thickness of the first metal wiring layer, and a thickness of the second metal wiring layer is equal to the thickness of the first metal wiring layer.

7. The OLED display panel as claimed in claim 5, wherein materials of the planarization layer and the pixel definition layer comprise organic photoresist.

8. The OLED display panel as claimed in claim 1, wherein a portion of the array substrate corresponding to the plurality of first grooves comprises a flexible substrate, an inorganic buffer layer, a blocking layer, a first gate insulating layer, a first metal wiring layer, a second gate insulating layer, a second metal wiring layer, an interlayer insulating layer, and a source drain metal layer.

9. The OLED display panel as claimed in claim 1, wherein a portion of the array substrate corresponding to the plurality of second grooves comprises a flexible substrate, an inorganic buffer layer, a blocking layer, a first metal wiring layer, a second metal wiring layer, an interlayer insulating layer, and a source drain metal layer.

10. An OLED display panel comprising a display area and a non-display area surrounding the display area, wherein the OLED display panel comprises:
an array substrate;
a first dam disposed on the array substrate, disposed in the non-display area, and surrounding the display area;
a second dam disposed on the array substrate, disposed in the non-display area, and surrounding the first dam, wherein the second dam and the first dam are spaced apart from each other;
a plurality of metal lines disposed in a fan-out area of the array substrate near a lower border, wherein the fan-out area comprises a first area and a second area, the plurality of metal lines in the first area are arranged in a direction perpendicular to the first dam, and angles between the plurality of metal lines in the second area and the first dam are acute; and
a plurality of first grooves defined in the fan-out area and arranged along the plurality of metal lines;
wherein a plurality of second grooves are defined in a portion of the array substrate corresponding to the second area and arranged in the direction perpendicular to the first dam.

11. The OLED display panel as claimed in claim 10, wherein a portion of the array substrate corresponding to the non-display area and away from the fan-out area comprises a flexible substrate, an inorganic buffer layer, a blocking layer, a first gate insulating layer, a first metal wiring layer, a second gate insulating layer, a second metal wiring layer, an interlayer insulating layer, a source drain metal layer, a planarization layer, and a pixel definition layer.

12. The OLED display panel as claimed in claim 11, wherein a sum of thicknesses of the first gate insulating layer and the second gate insulating layer is equal to a thickness of the first metal wiring layer, and a thickness of the second metal wiring layer is equal to the thickness of the first metal wiring layer.

13. The OLED display panel as claimed in claim 11, wherein materials of the planarization layer and the pixel definition layer comprise organic photoresist.

14. The OLED display panel as claimed in claim 10, wherein a portion of the array substrate corresponding to the plurality of first grooves comprises a flexible substrate, an inorganic buffer layer, a blocking layer, a first gate insulating layer, a first metal wiring layer, a second gate insulating layer, a second metal wiring layer, an interlayer insulating layer, and a source drain metal layer.

15. The OLED display panel as claimed in claim 10, wherein a portion of the array substrate corresponding to the plurality of second grooves comprises a flexible substrate, an inorganic buffer layer, a blocking layer, a first metal wiring layer, a second metal wiring layer, an interlayer insulating layer, and a source drain metal layer.

* * * * *